US006891666B2

(12) United States Patent
Darling et al.

(10) Patent No.: US 6,891,666 B2
(45) Date of Patent: May 10, 2005

(54) SEMICONDUCTOR OPTICAL AMPLIFIER WITH ELECTRONICALLY CONTROLLABLE POLARIZATION DEPENDENT GAIN

(75) Inventors: Geoff Darling, Toronto (CA); Ted Sargent, Toronto (CA)

(73) Assignee: Fox-Tek, Inc., Ontario (CA)

( * ) Notice: Subject to any disclaimer, the term of this patent is extended or adjusted under 35 U.S.C. 154(b) by 0 days.

(21) Appl. No.: 10/384,638

(22) Filed: Mar. 11, 2003

(65) Prior Publication Data

US 2004/0196541 A1 Oct. 7, 2004

(51) Int. Cl.$^7$ ................................................ H01S 3/00
(52) U.S. Cl. ........................................................ 359/344
(58) Field of Search ......................................... 359/344

(56) References Cited

U.S. PATENT DOCUMENTS

| | | | | |
|---|---|---|---|---|
| 4,918,701 A | * | 4/1990 | Amann et al. | 372/50 |
| 5,223,972 A | * | 6/1993 | Nishimura et al. | 359/337 |
| 6,487,007 B1 | * | 11/2002 | Morito | 359/344 |
| 6,549,331 B2 | * | 4/2003 | Walker et al. | 359/344 |

* cited by examiner

Primary Examiner—Mark Hellner
(74) Attorney, Agent, or Firm—Blank Rome LLP

(57) ABSTRACT

An optical amplifier has two amplifying sections formed in a semiconductor structure. The two amplifying sections have different ratios of gain for two polarization states (e.g., TE and TM). Thus the amplifier as a whole has a gain ratio determined by the gains of the two amplifying sections. The two amplifying sections are separately electronically controllable so as to control the gains of the two amplifying sections and thus the gain ratio of the amplifier as a whole. Such an amplifier can be made by quantum well intermixing.

11 Claims, 3 Drawing Sheets

SEMICONDUCTOR OPTICAL AMPLIFIER WITH ELECTRONICALLY CONTROLLABLE POLARIZATION DEPENDENT GAIN

FIELD OF THE INVENTION

The present invention is directed to a semiconductor optical amplifier (SOA) and more particularly to a SOA whose polarization dependence is controllable.

DESCRIPTION OF RELATED ART

Optical amplifiers are used in the telecommunications industry to amplify modulated light signals transporting information along an optical fiber. Periodic amplification is required because of the small residual loss of optical fiber and the additional insertion losses cause by other components inserted along the fiber. Without optical amplification, the light signal would have to be converted to an electronic one and then reconverted into a modulated light signal. Such optical-electronic-optical (OEO) conversions are expensive and introduce bottlenecks in the network due to the comparatively slow processing time of electronics.

As a result, a great deal of prior art exists relating to optical amplification for fiber optic communications. In their simplest embodiment, semiconductor devices can be designed to function as semiconductor optical amplifiers (SOA) by preventing feedback from occurring in a Fabry-Perot laser cavity as described in IEEE Spectrum, May 1984, by Soichi Kobayashi and Tasuya Kimura. Feedback suppression is often achieved by anti-reflection coating the two facets of the device to suppress the unacceptably large Fresnel reflectivity of the semiconductor-air interface. With such coatings, a so-called travelling wave amplifier results in which light to be amplified is coupled into the device with suitable optics and current is injected through the active region to control the optical gain. Said light is amplified through stimulated emission as it travels along the lengths of the SOA device. When it reaches the end facet of said device, the vast majority of the light is coupled back out into free-space. In modern fiber optic communications, light is often coupled into and out of SOA devices from optical fiber. In standard optical fiber, there is no preferred polarization state because of the circular symmetry of the waveguide structure. Light coupled into standard optical fiber with a well-defined linear polarization does not emerge from the fiber with the same well-defined polarization. The light emerging from the fiber will generally possess an unpredictable superposition of two orthogonal polarization states that changes randomly with time. Since at any given time the light signals travelling along the fiber can have any polarization, optical devices such as filters, attenuators, multiplexers, etc. are designed to exhibit polarization-independent behaviour. This way network operators can be assured that the network will function properly for any polarization state that may occur.

Polarization independence is also an important property desired of optical amplifiers. A great deal of prior art teaches how to achieve very low polarization dependence in optical amplifiers. Polarization dependence is introduced into SOA devices by the design of the waveguide and the gain medium. Numerous reports of near-polarization-independent SOA devices have been presented in trade magazines and scientific journals over the past 5–10 years. Furthermore, several commercial entities manufacture near polarization independent SOA devices for fiber optic networks (for example: Kamelian Inc., JDS Uniphase, Genoa). These companies offer SOA devices that are designed to provide a fixed amount of gain with acceptably low polarization dependence. This is generally achieved through maintaining a constant drive current and a constant device temperature. However, these SOA designs cannot provide polarization independence over a range of end-to-end gains without the use of an external variable optical attenuator (VOA). Changes in drive current required to alter the gain would alter the balance between TE and TM gain and thus introduce undesirable polarization dependence into the device. To avoid this problem, VOA are used to control the end-to-end gain while keeping the SOA drive current constant. From a network control perspective, it is much more attractive to provide a single device which can provide all of these functions in an integrated manner. This will avoid the cost and complexity of manufacturing, combining, and controlling these multiple discrete sub-modules.

It is possible to provide polarization-independent gain over a range of currents and hence end-to-end gain values. One way to do so is by combining tensile and compressive wells.

There have been early techniques (~1993) used to achieve polarization-independent gain over a range of operating currents. The work in that area includes the following:

A. Mathur and P. D. Dapkus, "Polarization insensitive strained quantum well gain medium for lasers and optical amplifiers," *Appl. Phys. Lett.*, vol. 61, 1992.

L. F. Tiemeijer, P. J. A. Thijs, T. van Dongen, R. W. M. Slootweg, J. M. M. van der Heijden, J. J. M. Binsma, and M. P. C. M. Krijn, "Polarization insensitive multiple quantum well laser amplifiers for the 1300 nm window," *Appl. Phys. Lett.*, vol. 62, February 1993.

M. Newkirk, B. Miller, U. Koren, M. Young, M. Chien, R. Jopson, and C. Burrus, "1.5 micron multiquantum-well semiconductor optical amplifier with tensile and compressively strained wells for polarization-independent gain," *IEEE Photon. Technol. Lett.*, vol. 4, April 1993."

Mathur et al made important progress towards polarization-independent SOA designs that were independent of current. They incorporated 3 compressive and 3 tensile-strained quantum wells into a single active region. Polarization independent gain was achieved for a specific combination of device length and drive current at 1300 nm. Shortly after, Tiemeijer et al refined the design to provide balanced gain over a much larger range of operating parameters. Their design used three 1%-tensile strained 110 Å wells and four 1%-compressively strained 45 Å wells. TE/TM gain was balanced to within 1 dB for drive currents from 25 to 200 mA with 3-dB spectral widths of approximately 30–40 nm at 1300 nm. This same approach was applied successfully at 1500 nm by Newkirk et al where a 3-dB gain bandwidth of approximately 100 nm was demonstrated.

As a sidenote, in the late 1990s, other techniques using delta-strained quantum wells and superlattices yielded polarization-independent gain over reasonable current ranges.

However, the devices described above are more difficult to fabricate than is desirable. Also, they do not permit dynamic control of the polarization dependence of the gain. Thus, there is a need in the art for single SOA device that provides low polarization dependent gain over a range of end-to-end gains, that is easier to fabricate, and that is dynamically controllable.

In another area of endeavor, a quantum well intermixing (QWI) technique for locally altering the optical characteristics of a multiple quantum well structure is disclosed in US 2002/0030185 A1, published Mar. 14, 2002, whose disclosure is hereby incorporated by reference in its entirety into the present disclosure. The technique will be disclosed here, with revisions to represent current knowledge.

FIG. 1 shows a typical InGaAsP multiple quantum well structure 10 of a laser device. The structure 10 is grown by GSMBE in sequential layers starting from a 5000 Å InP Buffer layer 22 which itself is formed on an n+InP substrate 11. The next layer grown on top of the InP buffer layer 22 is an 800 Å 1.15Q guiding layer 18a. The following layers grown above the guiding layer 18a form a conventional quantum well active region 13, which comprises three quantum well layers 16 and four 1.24Q quaternary layers 17. The 1.24Q quaternary layers 17 provide barrier regions of higher bandgap energy between the quantum well layers 16. Optical emissions are generated within this quantum well active region 13. A second 1.15Q guiding layer 18b is grown on top of the last quaternary layer 17. Optical emission generated in the active region 13 is mostly confined between the guiding layers 18a, 18b in order to concentrate the optical output emission from the laser device. A 250 Å InP grating layer 14 is grown above the second 1.15Q guiding layer 18b and used in the process of etching a grating for a Distributed Feed-Back (DFB) laser. A 50 Å InGaAsP layer 19 grown above the InP grating layer 14 is used as an etch stop layer for removal of the LT-InP layer 20 after patterning and removal of the remaining InP defect layer, and completeing the RTA process. This layer protects the underlying InP layer from being etched away during the removal of the InP defect layer 20. The layers 14, 19 and 20 are initially undoped but doped p-type at 5–6×10$^{17}$ upon growth over etched gratings. The InGaAsP layer 19 also protects the InP/1.15Q grating layers 14 and 18b from contamination prior to etching the grating. A 1000 Å InP defect layer 20 is grown above the InGaAsP layer 19 for the quantum well intermixing process. These defects have been postulated to be donor-like Phosphorus-antisites or acceptor-like Indium-Vacancies. Using standard photolithography, this layer is patterned and etched to define the areas to be modified by QWI During the RTA process, defects in the InP defect layer 20 diffuse into the quantum well region 13. On completion of the photolithography/etching and the RTA process, the defect layer 20, the etch stop layer 19 and the grating layer 14 are etched away. This etching process may be used to introduce a grating, if required, into the 1.15Q guiding layer 118b. Subsequently the device structure will be completed with additional growth of layers which are typically in sequence InP 14, InGaAsP etch stop 19, InP 21 and finally the 1000 Å InGaAs contact layer 15. The InGaAs layer 15 is a contact layer for applying current to the device. Doping levels and type of these layers depends on the type of device being fabricated. The InGaAs contact layer and the layer of InP 21 is normally etched into a ridge structure for confining and guiding the applied device current from the InGaAs contact layer 15 to a narrow region of the quantum well active region 13. The 1 μm InP layer 21 and the InGaAs contact layer 15 are grown after the RTA process, once the quantum well active region structure 13 has been grown. All layers with the exception of the InP defect layer 20 are typically used in optoelectronic device fabrication. Once the InP defect layer 20 has been used in the quantum well intermixing process in accordance with the present invention, it is removed from the device structure 10.

In this example all layers of the quantum well structure 10 are grown by GSMBE at a rate of 1 μm/hr on an n-type InP substrate 11. Group V constituent atoms are supplied in the form of As$_2$ and P$_2$ derived from the pyrolysis of AsH$_3$ and PH$_3$ in a single, two zone low pressure cracker with a Ta catalyst operating at 1000° C. All layers except the InP defect layer 20 are grown at 470° C. with the group V total flow rate of 4 or 5 sccm. The InP defect layer 20 is grown at a low temperature (LT) of 300° C. and is referred to as LT-InP. Rapid thermal annealing (RTA) is carried out under a flowing nitrogen ambient, using a halogen lamp rapid thermal annealing system.

In accordance with the parent application, during the RTA process, point defects in the LT-InP defect layer 20 diffuse into the active region 13 of the quantum well structure 10 and modify its composite structure. This controlled interdiffusion process causes a large increase in the bandgap energy of the quantum well active region 13. This is referred to as a wavelength blue shift. Applying wavelength blue shift to a selected region of the quantum well active region 13 increases its transparency without the need for external biasing. This is due to the quantum well bandgap increase which has a higher energy than the generated incident photons. Therefore, the generated photons pass through the transparent quantum well region without being absorbed by electron/hole pairs.

In an alternative embodiment disclosed in the parent application, two types of defect containing layers are grown for the quantum well intermixing process. Both are grown as individual layers on top of the quantum well active region structure, and the defects they contain diffuse into the quantum well active region following a rapid thermal annealing (RTA) process. One of the diffused defect types (LT-InP) generates a bandgap wavelength blue shift in the quantum well active region, resulting in the transparency of this region. The other (He-plasma InP) diffuses defects of a type that also decreases carrier lifetime in the quantum well active region as well as introducing a bandgap wavelength blue shift and transparency. This reduction in carrier lifetime enables the InGaAsP quantum well active region to exhibit an ultra high speed response, which is particularly suitable for enabling high speed integrated optoelectronic device fabrication. The following paragraphs describe the growth process and properties of these defect types in more detail.

Referring to FIG. 2, the InGaAsP quantum well structure is grown on a 5000 Å InP buffer layer 110 which itself is formed on an n+InP substrate 120. The next layer grown on top of the InP buffer layer 110 is an 800 Å 1.15Q guiding layer 108a. The following layers grown above the guiding layer 108a form a conventional quantum well active region 103, which comprises three quantum well layers 106 and four 1.24Q quaternary layers 107. The 1.24Q quaternary layers 107 provide barrier regions of higher bandgap energy between the quantum well layers 106. Optical emissions are generated within this quantum well active region 103. A second 1.15Q guiding layer 108b is grown on top of the last quaternary layer 107. Optical emission generated in the active region 103 is confined between the guiding layers 108a, 108b in order to concentrate the optical output emission from the laser device. An InP defect layer 112 is grown above the second 1.15Q guiding layer 108b. This InP layer 112 is grown using a combination of GSMBE and an electron cyclotron resonance (ECR) Helium-Plasma source. During growth, the InP layer 112 is grown under conventional GSMBE conditions, except that the epilayers of the InP 112 are exposed to a flux of helium particles from an ECR source mounted on the growth chamber. By exposing the InP layer 112 to the Helium flux, diffusing vacancy-type defects are produced in the InP layer 112. The thickness of this InP defect layer 112 can be optimized for particular device performance, but successful performance has been demonstrated for a defect layer 112 thickness of 400 Å. This is usually covered with an InP layer of 1000 Å thickness 102 grown at normal temperature (NT-InP). Using standard photolithography these layers are patterned and etched to define the areas to be modified by QWI. On completion of the photolithographic patterning/etching and the RTA process, the layers 102, and 112 (defect layer) are etched away and a thick 1 μm layer of InP 114 is grown in its place. A 1000 Å InGaAs contact layer 105 is grown over the 1 μm InP layer 114, wherein the InGaAs layer 105 is a contact layer for applying current to the device. The 1 μm layer of InP 114 is normally etched into a ridge structure for laterally confining the light and guiding the applied device current from the InGaAs contact layer 105 to a narrow region of the quantum well active region 103. The 1 μm InP layer 114 and the InGaAs contact layer 105 are grown after the RTA process, hence on top of the 1.15Q layer 18b which may contain a grating for a DFB laser. All layers with the exception of the InP layers 102, and 112 (defect layer) are typically used in optoelectronic device fabrication. In accordance with this aspect of the present invention, the InGaAsP etch stop layer previously shown in FIG. 1 is not grown over the quantum well active region 103 where quantum well intermixing occurs. This is due to the InGaAsP etch stop layer obstructing the diffusion of the defects into the quantum well active region 103.

Once quantum well intermixing is induced by the rapid thermal anneal (RTA) process, the defects in the InP defect layer 112, diffuse into the quantum well active region. These vacancy-type defects in the He-plasma InP layer 112 diffuse into the quantum well active region 103, providing both QWI and deep states that quench the photoluminescence and reduce carrier lifetime within the bandgap. The deep states are intermediate energy levels created within the bandgap of the quantum well active region 103. These intermediate states suppress radiative transitions within the quantum well active region 103, by providing an additional carrier recombination step during conduction band to valence band carrier recombination. The resulting short recombination times of carriers between the conduction band and intermediate deep state levels decreases the carrier lifetime. The diffusing group V vacancy-type type defects also cause QWI as they diffuse into the quantum well active region 103, generating a bandgap wavelength blue shift. This causes the quantum well active region 103 to become transparent, permitting incident photons to pass through this region without being absorbed.

The thickness of the InP defect layer 112 has to be sufficient to supply enough deep states to the quantum well active region 103 whilst simultaneously producing sufficient wavelength blue shift. The physical order of the layers 112, 102 must also be maintained during GSMBE growth Or the defects from the He-plasma InP 112 must diffuse further in order to reach the active region 13 requiring higher RTA temperatures or times in order to obtain the desired wavelength blues hift and reduced carrier lifetime. Once the RTA process is complete, the defect layers 102, 112 are etched away, and current guiding and contact layers 114, 105 are grown for applying electrical current to the device.

However, the principles of the above-captioned parent application have not yet been applied to the problems noted above.

SUMMARY OF THE INVENTION

It will be readily apparent from the above that a need exists in the art for a means of overcoming the above-noted problems with the prior art. It is the primary object of this invention to provide an SOA device that amplifies light that is passed through it.

It is an object of this invention to provide an SOA device that can amplify light over a broad range of wavelengths that could be used in a fiber optic communications network.

It is another object of the invention to provide an SOA device in which polarization independence can be easily implemented.

It is still another object of this invention to provide an SOA device that amplifies light polarized in the TE and TM mode with an electronically controllable ratio of end-to-end gains.

To achieve the above and other objects, the present invention is directed to an SOA device comprised of two sections along the device length. Light directed through said device will pass through one section and then the other, confined within a continuous waveguide structure. Each section will possess separate electrical contacts on the top surface of said device to allow for separate control over the current injected through each section. Injected current through each section contributes to a population inversion in the active region so that optical amplification can occur. The portion of the spectrum over which optical gain can be observed is determined by the properties of the active region of the SOA device.

The present invention is directed to a semiconductor optical device for amplifying light passed through it and includes a body built up from a plurality of layers of different materials. This is directed to a device that amplifies a broad range of wavelengths where the light may have components polarized parallel (TE) and perpendicular (TM) to the plane of the device. More particularly, this device provides an end-to-end optical gain with electronic control over the ratio of the gains provided to each of two orthogonal polarization modes, conventionally labelled TE and TM.

More particularly, the present invention is directed to a SOA device built up from a plurality of layers with different compositions. Among these layers is what is known in the art as a multiple quantum well (MQW) structure that, when current is injected through it, produces optical radiation over a portion of the optical spectrum determined by the dimensions and compositions of the layers comprising said structure. The layers of the SOA device are designed in a manner known in the art to provide transverse confinement of the optical radiation that travels through the SOA device through both sections. Said waveguide structure ensures that the optical radiation travelling through the device is concentrated over the MQW structure so that efficient optical amplification occurs. The region of the SOA device known in the art as the active region includes said MQW and waveguide structures. It has been shown in the art that proper design of the active region can result in SOA devices with very low polarization dependence. Such designs require that the product of the confinement factors and the net material gain coefficients for each mode (TE and TM) be equal across the portion of the spectrum where the device will operate. It is well documented in the art that TE and TM material gain coefficients can be adjusted in MQW structures through the introduction of tensile and compression strains.

To achieve an SOA device with a controllable polarization dependent gain, the present invention uses a post-growth process to modify an existing MQW-based, SOA design with very low polarization dependence (TE/TM gain≈1) that is known in the art. The purpose of this modification is to change the TE/TM gain coefficient ratio in one section of the device. Section A will be unaffected by the modifications while the gain properties of Section B will be changed. This involves a patent-pending QWI process that is known to increase the TM gain coefficient relative to the TE coefficient. The section that undergoes the QWI will possess a different TE/TM gain ratio after processing (TE/TM<1) and its gain spectrum will be blue-shifted. The portion of each section's gain spectrum that overlaps will have a controllable polarization dependent gain. Changing the current in the section of the device that underwent QWI (Section B) will alter the TE/TM gain ratio from the original design value. Another possible approach could begin with a MQW-based, SOA design that has a TE/TM gain ratio large than one. This is the case in standard, lattice-matched MQW structures. Subsequent QWI performed on one section would reduce its TE/TM gain ratio. The end result would be an SOA device that could provide a variable TE/TM ratio.

BRIEF DESCRIPTION OF THE DRAWINGS

A preferred embodiment of the present invention will be disclosed with reference to the drawings, in which.

DETAILED DESCRIPTION OF THE PREFERRED EMBODIMENT

An embodiment of this invention utilizes post-growth QWI methods to modify existing MQW based SOA device designs known in the art (For example, Katsuaki Magari et al, "Polarization Insensitive Traveling Wave Type Amplifier Using Strained Quantum Well Structure", IEEE Photonics Technology Letters, Vol. 2, No. 8, August 1990). In this prior art, tensile strain is introduced into the MQW structure by mismatching the lattice constant of the barrier layers by −1.7%.

For the preferred embodiment, any of the techniques disclosed in US 2002/0030185 A1, cited above, would be deployed to modify a design using a strained quantum wells. This QWI technique uses low temperature InP capping layers as a source of vacancy-type defects to promote the interdiffusion within the quantum well structure of the device. Using this process, excellent control over the relative degree of intermixing between section A and B of the device is achieved. The two main design criteria for applying this invention are: (1) the as-grown polarization dependent gain properties of the SOA device; and (2) the changes induced to these properties by the QWI process.

The two section lengths, $L_A$ and $L_B$, can have lengths from a few hundred microns to over a millimeter. These lengths can be equal or made different during the cleaving process to provide additional control over the relative gains provided from each section of the device.

The schematic diagram of the preferred embodiment uses a ridge waveguide design. This invention can be applied to other waveguide geometries with equivalent results. More detailed prior art relating to common SOA structures is provided by: Michael J. Connelly in "Semiconductor Optical Amplifiers", Kluwer Academic Press, 2002.

Figure 1:
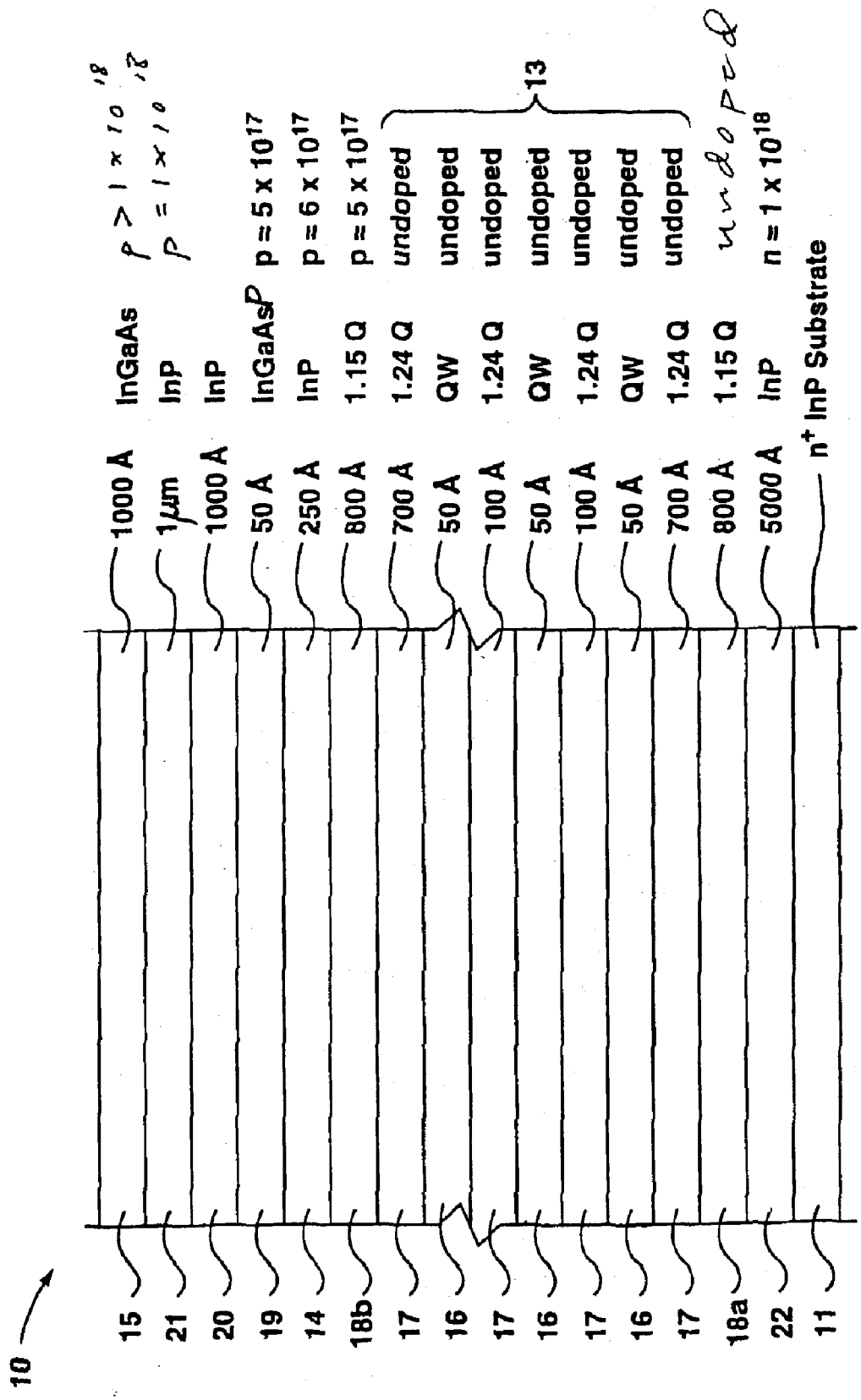
FIGS. 1 and 2 show two quantum well structures produced according to the technique of the above-cited previous patent application.
Figure 2:
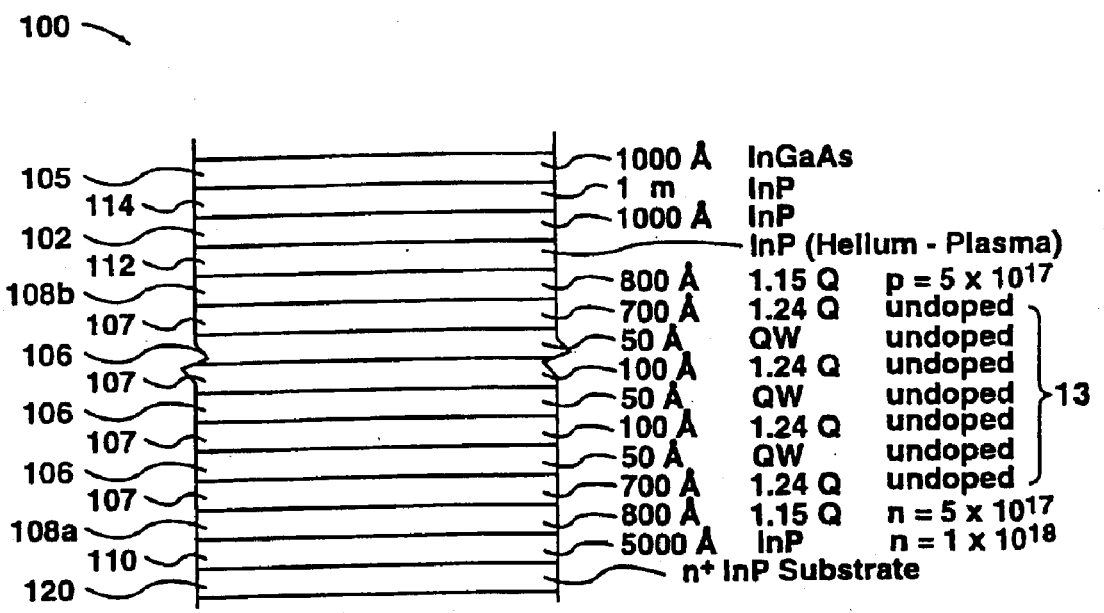
Figure 3:
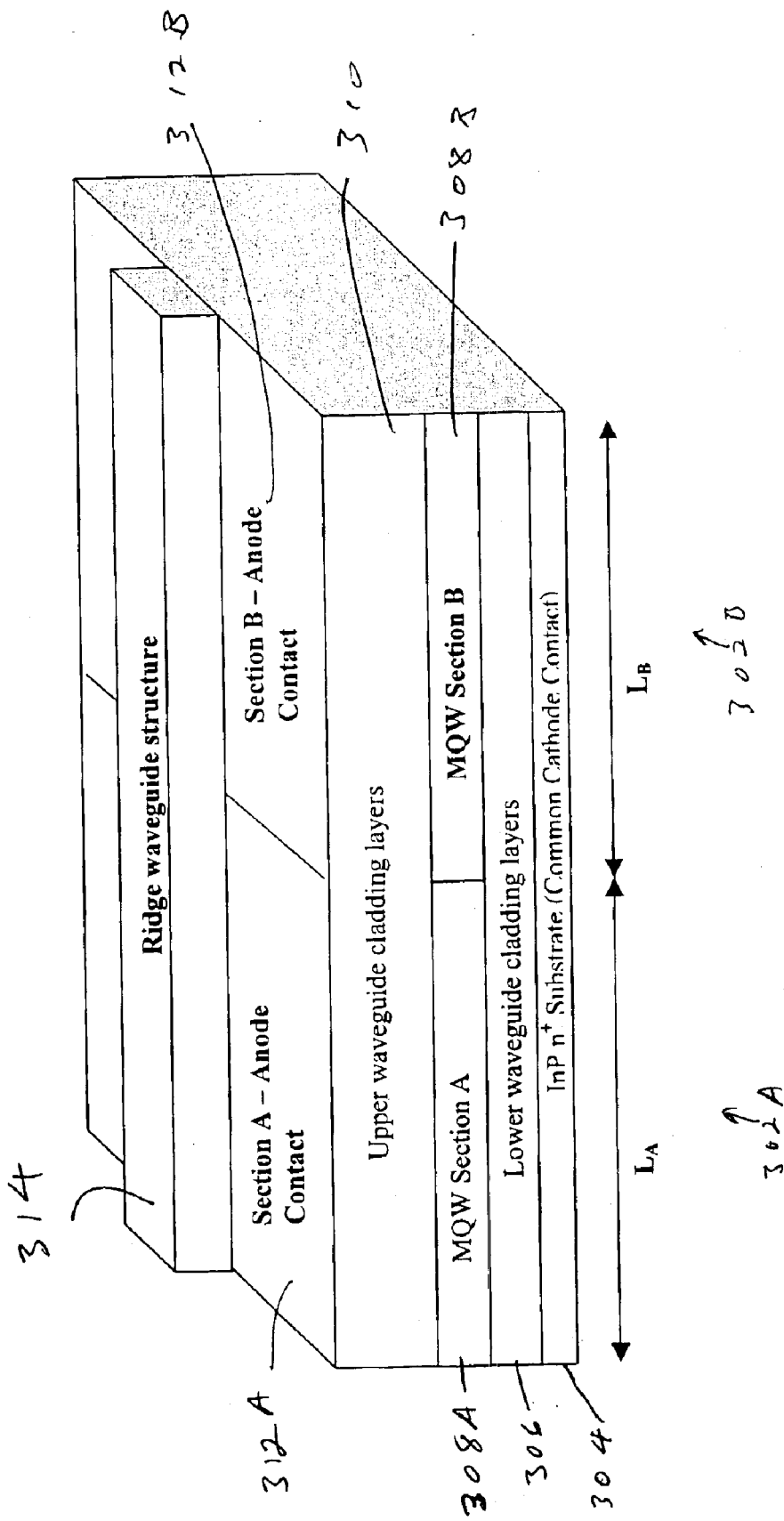
FIG. 3 shows an amplifier according to the preferred embodiment.

In the preferred embodiment, as shown in FIG. 3, the amplifier 300 is formed in two sections, 302A and 302B, having lengths $L_A$ and $L_B$, respectively. The sections share a common cathode contact in the form of an InP n+substrate 304 and lower waveguide cladding layers 306. However, they have separate MQW layers 308A and 308B with different, separately controllable polarization properties. On top of the MQW layers 308A, 308B are formed waveguide cladding layers 310, separate anode contacts 312A, 312B for independent control of the sections, and a ridge waveguide structure 314.

As noted above, one section 302A has an unmodified MQW section 308A which amplifies light with very little polarization dependence (that is, TE/TM gain≈1). However, the MQW section 308B of the second section 302B has its properties modified so that it amplifies light with more polarization dependence (that is, TE/TM<1).

The amplifier 300 is used in the following manner. Light is applied to the MQW sections 308A and 308B and is amplified therein. If the polarization of the light does not require much modification, a stronger signal is applied to the anode contact 312A than to the anode contact 312B, so that the amplification with a low polarization dependency predominates. However, if the polarization of the light does require modification, the signal applied to the anode contact 312B is increased accordingly.

While a preferred embodiment of the present invention has been set forth in detail above, those skilled in the art who have reviewed the present disclosure will readily appreciate that other embodiments can be realized within the scope of the invention. For example, recitations of specific materials and numerical ranges are illustrative rather than limiting. Also, either or both of the amplifying sections can have their characteristics altered through intermixing to have any desired combination of TE/TM<1, TE/TM≈1 and TE/TM>1. Therefore, the present invention should be construed as limited only by the appended claims.

What is claimed is:

1. An optical amplifier for amplifying a light signal while providing a controllable gain ratio between first and second polarization states of the light signal, the optical amplifier comprising:

a first amplifying section having a first gain ratio between the first and second polarization states;

a second amplifying section, in optical communication with the first amplifying section, having a second gain ratio between the first and second polarization states; and a plurality of electrodes, in electrical communication with the first and second amplifying sections, for independently controlling the first and second amplifying sections;

wherein optical properties of the first or second amplifying section are altered through quantum well intermixing to alter the first or second gain ratio.

2. The optical amplifier of claim 1, wherein the plurality of electrodes comprise:

a common cathode in contact with both the first and second amplifying sections;

a first anode in contact with the first amplifying section; and a second anode in contact with the second amplifying section.

3. The optical amplifier of claim 1, wherein the first and second amplifying sections are formed in a monolithic semiconductor device.

4. The optical amplifier of claim 3, wherein each of the first and second amplifying sections comprises a multiple quantum well section.

5. The optical amplifier of claim 4, wherein, in each of the first and second amplifying sections, the multiple quantum well section is an InGaAsP multiple quantum well section.

6. A method of making an optical amplifier for amplifying a light signal while providing a controllable gain ratio between first and second polarization states of the light signal, the method comprising:

(a) forming a first amplifying section having a first gain ratio between the first and second polarization states;

(b) forming a second amplifying section having a second gain ratio between the first and second polarization states;

(c) placing the second amplifying section in optical communication with the first amplifying section; and (d) providing a plurality of electrodes, in electrical communication with the first and second amplifying sections, for independently controlling the first and second amplifying sections;

wherein at least one of steps (a) and (b) comprises altering optical properties of the first or second amplifying section through quantum well intermixing to alter the first or second gain ratio.

7. The method of claim 6, wherein steps (a)–(c) are performed by forming the first and second amplifying sections in a monolithic semiconductor device.

8. The method of claim 7, wherein each of the first and second amplifying sections comprises a multiple quantum well structure.

9. The method of claim 8, wherein, in each of the first and second amplifying sections, the multiple quantum well structure is an InGaAsP multiple quantum well structure.

10. The method of claim 9, wherein the quantum well intermixing comprises applying at least one InP defect layer and performing a rapid thermal annealing process.

11. A method of amplifying a light signal while providing a controllable gain ratio between first and second polarization states of the light signal, the method comprising:

(a) providing an optical amplifier comprising:

a first amplifying section having a first gain ratio between the first and second polarization states;

a second amplifying section, in optical communication with the first amplifying section, having a second gain ratio between the first and second polarization states; and a plurality of electrodes, in electrical communication with the first and second amplifying sections, for independently controlling the first and second amplifying sections;

wherein optical properties of the first or second amplifying section are altered through quantum well intermixing to alter the first or second gain ratio;

(b) introducing the light signal into the optical amplifier; and (c) controlling the first and second amplifying sections through the plurality of electrodes to control the controllable gain ratio.

* * * * *